United States Patent
Otake et al.

(10) Patent No.: US 10,050,070 B2
(45) Date of Patent: Aug. 14, 2018

(54) SEMICONDUCTOR DEVICE AND ELECTRONIC APPARATUS

(71) Applicant: SONY SEMICONDUCTOR SOLUTIONS CORPORATION, Kanagawa (JP)

(72) Inventors: Yusuke Otake, Kanagawa (JP); Toshifumi Wakano, Kanagawa (JP)

(73) Assignee: Sony Semiconductor Solutions Corporation, Kanagawa (JP)

( * ) Notice: Subject to any disclaimer, the term of this patent is extended or adjusted under 35 U.S.C. 154(b) by 0 days.

(21) Appl. No.: 15/567,808

(22) PCT Filed: Apr. 13, 2016

(86) PCT No.: PCT/JP2016/002000
§ 371 (c)(1),
(2) Date: Oct. 19, 2017

(87) PCT Pub. No.: WO2016/189792
PCT Pub. Date: Dec. 1, 2016

(65) Prior Publication Data
US 2018/0090533 A1    Mar. 29, 2018

(30) Foreign Application Priority Data
May 27, 2015 (JP) ................. 2015-106941

(51) Int. Cl.
    *H01L 27/146*     (2006.01)
    *H01L 27/30*     (2006.01)
(52) U.S. Cl.
    CPC .. *H01L 27/14603* (2013.01); *H01L 27/14605* (2013.01); *H01L 27/14607* (2013.01);
(Continued)

(58) Field of Classification Search
    CPC ......... H01L 27/14641; H01L 27/14603; H01L 27/14621; H01L 27/307; H01L 27/16427;
(Continued)

(56) References Cited

U.S. PATENT DOCUMENTS

| 2011/0049333 A1 | 3/2011 | Yamashita |
|---|---|---|
| 2011/0156104 A1 | 6/2011 | Yamaguchi |

(Continued)

FOREIGN PATENT DOCUMENTS

JP     2011-029337     2/2011

OTHER PUBLICATIONS

International Search Report and Written Opinion prepared by the European Patent Office dated Jun. 24, 2016, for International Application No. PCT/JP2016/002000.

*Primary Examiner* — Joseph C Nicely
(74) *Attorney, Agent, or Firm* — Sheridan Ross P.C.

(57) ABSTRACT

A semiconductor device includes a plurality of pixels arranged in a two-dimensional array, each pixel of the plurality of pixels including a photoelectric conversion film configured to photoelectrically convert light of a first wavelength and pass light of a second wavelength, and a photoelectric conversion unit configured to photoelectrically convert the light of the second wavelength. The semiconductor device may further include a charge storage unit configured to store charge received from the photoelectric conversion unit of each pixel in a pixel group, wherein the pixel group includes adjacent pixels among the plurality of pixels, a plurality of through electrodes, and a wiring layer coupled to the photoelectric conversion film of each pixel of the plurality of pixels by at least one through electrode of the plurality of through electrodes. The present technology can be applied to a solid-state imaging element.

18 Claims, 15 Drawing Sheets

(52) U.S. Cl.
CPC .. *H01L 27/14614* (2013.01); *H01L 27/14621* (2013.01); *H01L 27/14627* (2013.01); *H01L 27/14638* (2013.01); *H01L 27/14641* (2013.01); *H01L 27/14667* (2013.01); *H01L 27/307* (2013.01); *H01L 27/1464* (2013.01)

(58) Field of Classification Search
CPC ......... H01L 27/14667; H01L 27/14638; H01L 27/14614; H01L 27/14601; H01L 27/14605; H01L 27/14607
See application file for complete search history.

(56) References Cited

U.S. PATENT DOCUMENTS

| | | |
|---|---|---|
| 2013/0033628 A1 | 2/2013 | Yamaguchi |
| 2015/0001376 A1 | 1/2015 | Miyanami |
| 2017/0243912 A1* | 8/2017 | Kaneda ................. H04N 9/045 |
| 2018/0047789 A1* | 2/2018 | Yamaguchi ........... H01L 27/286 |

* cited by examiner

[Fig. 1]

[Fig. 3]
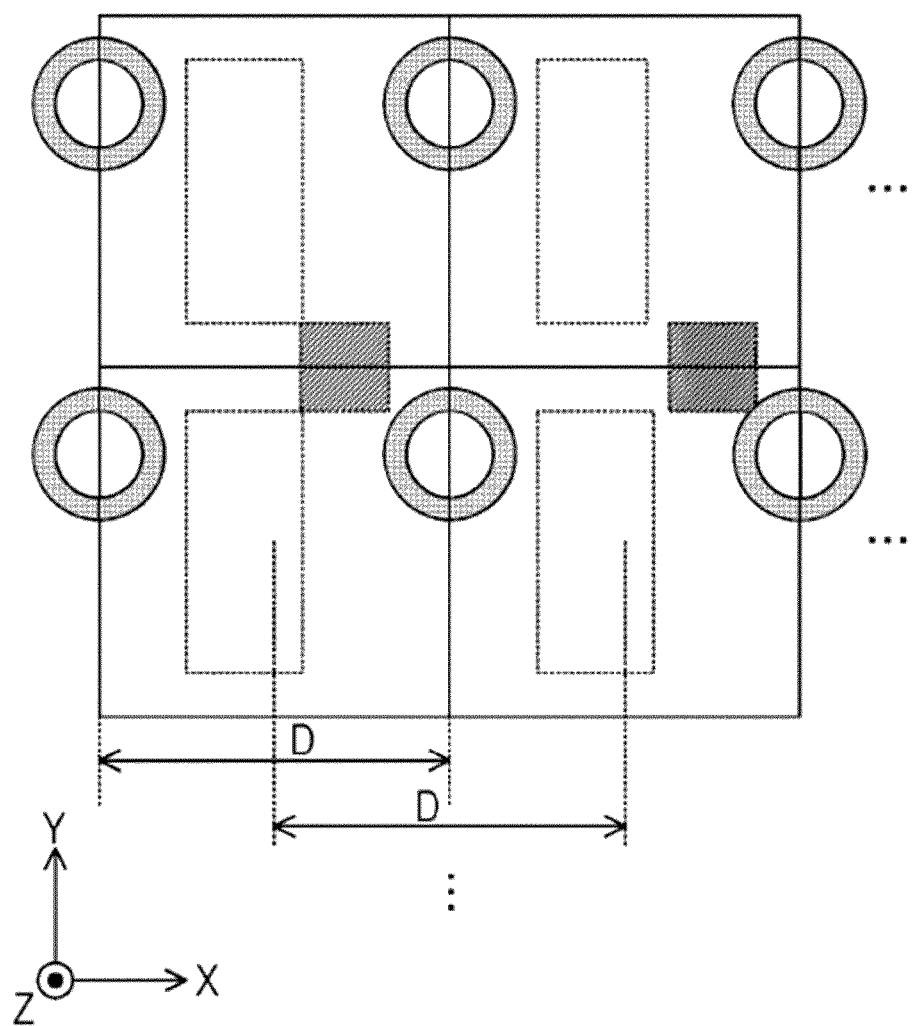

[Fig. 4]
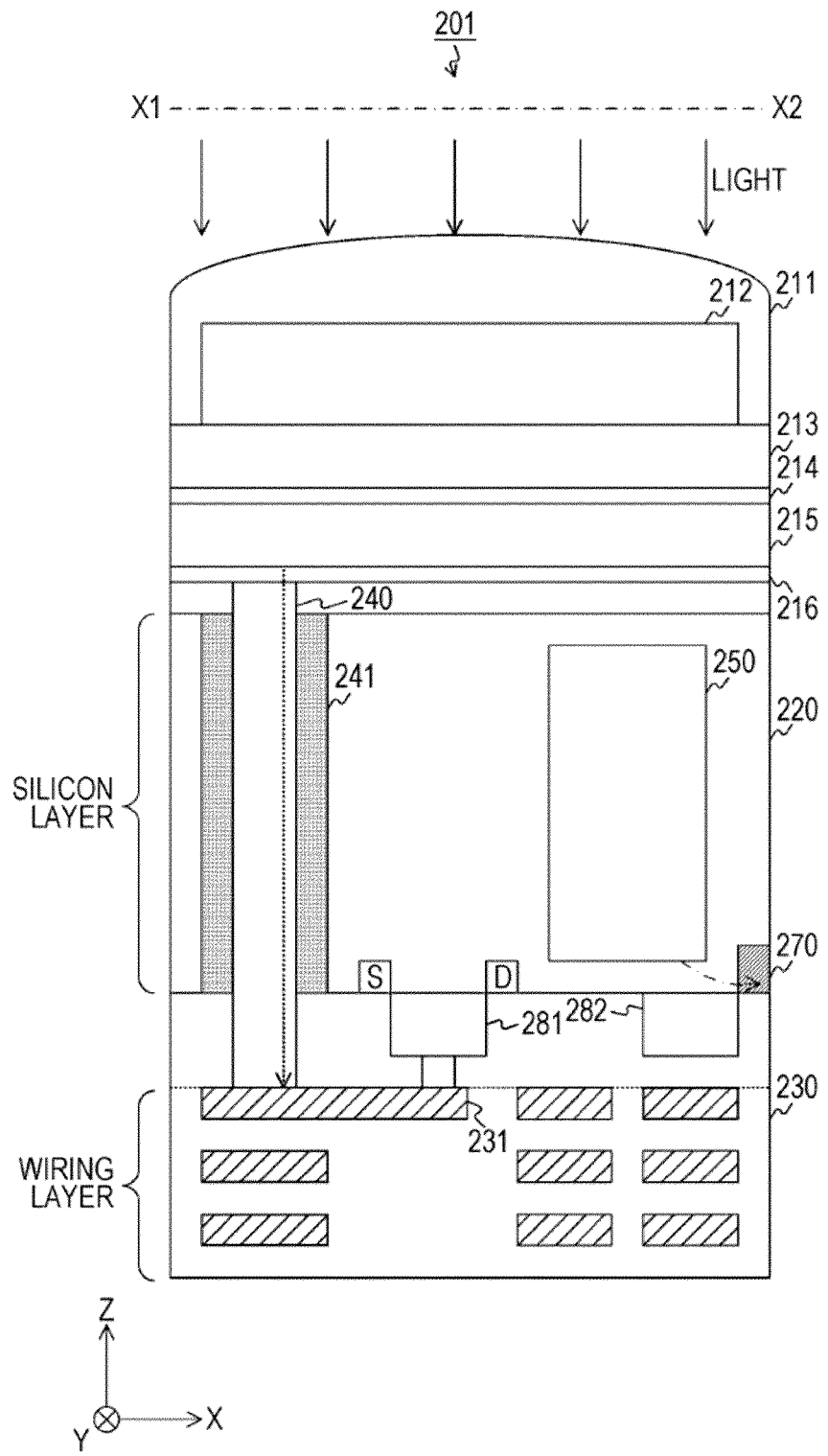

[Fig. 5]
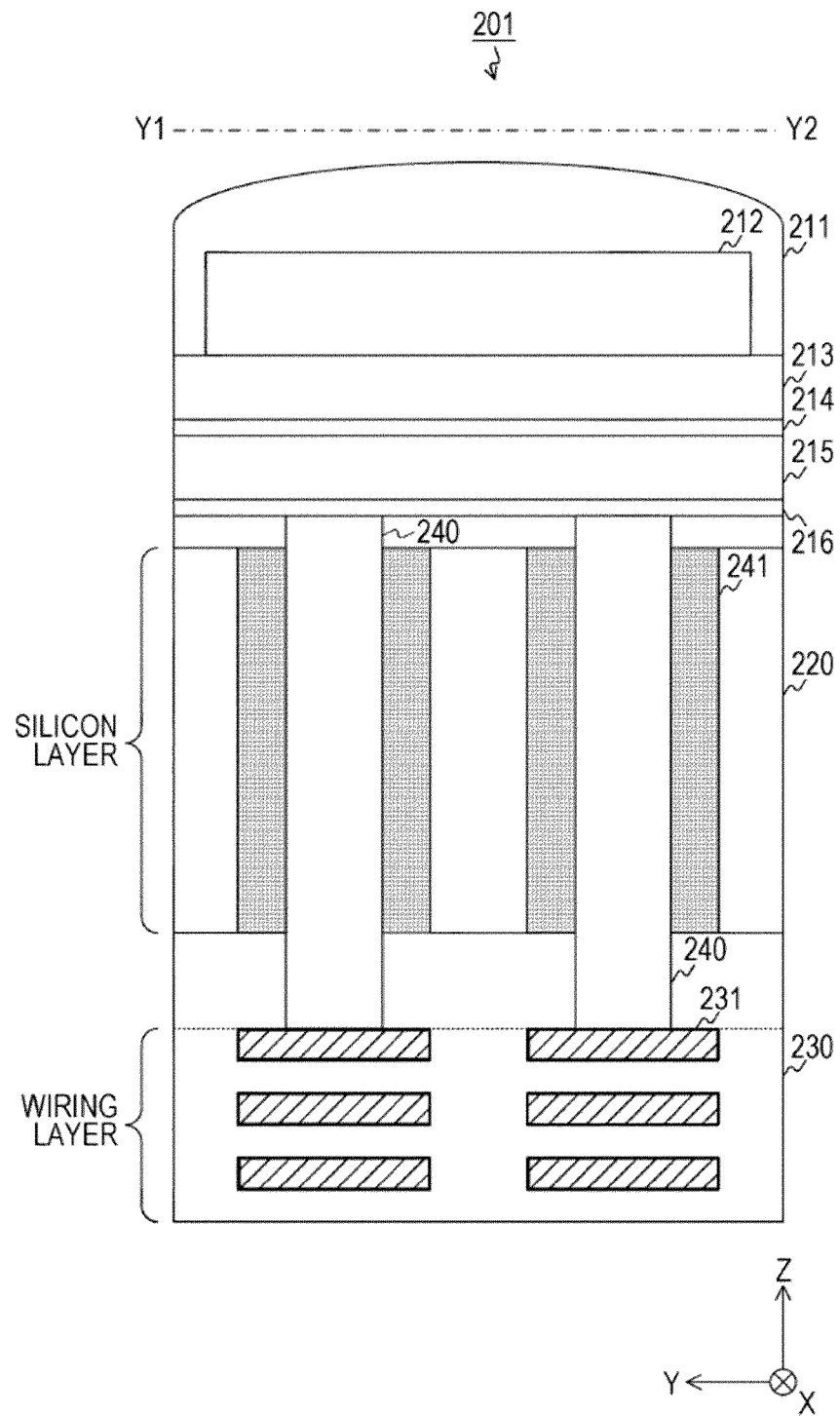

[Fig. 6]
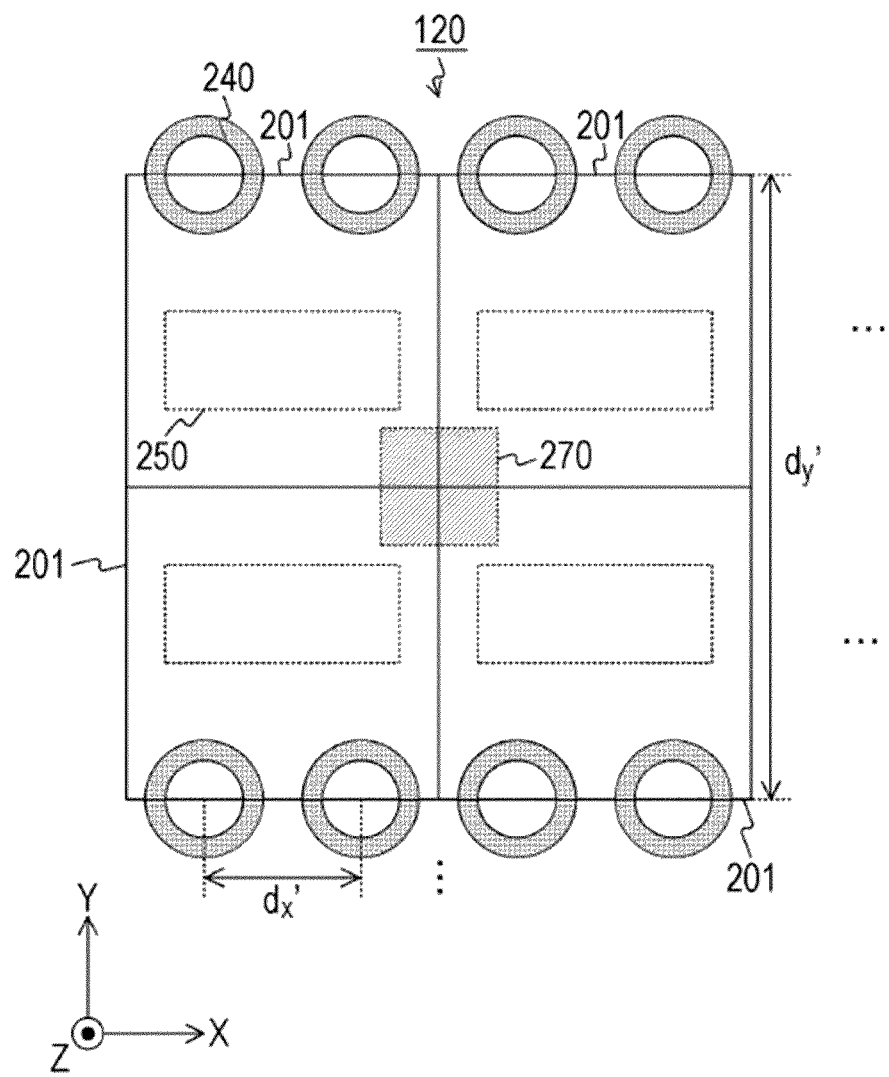

[Fig. 7]
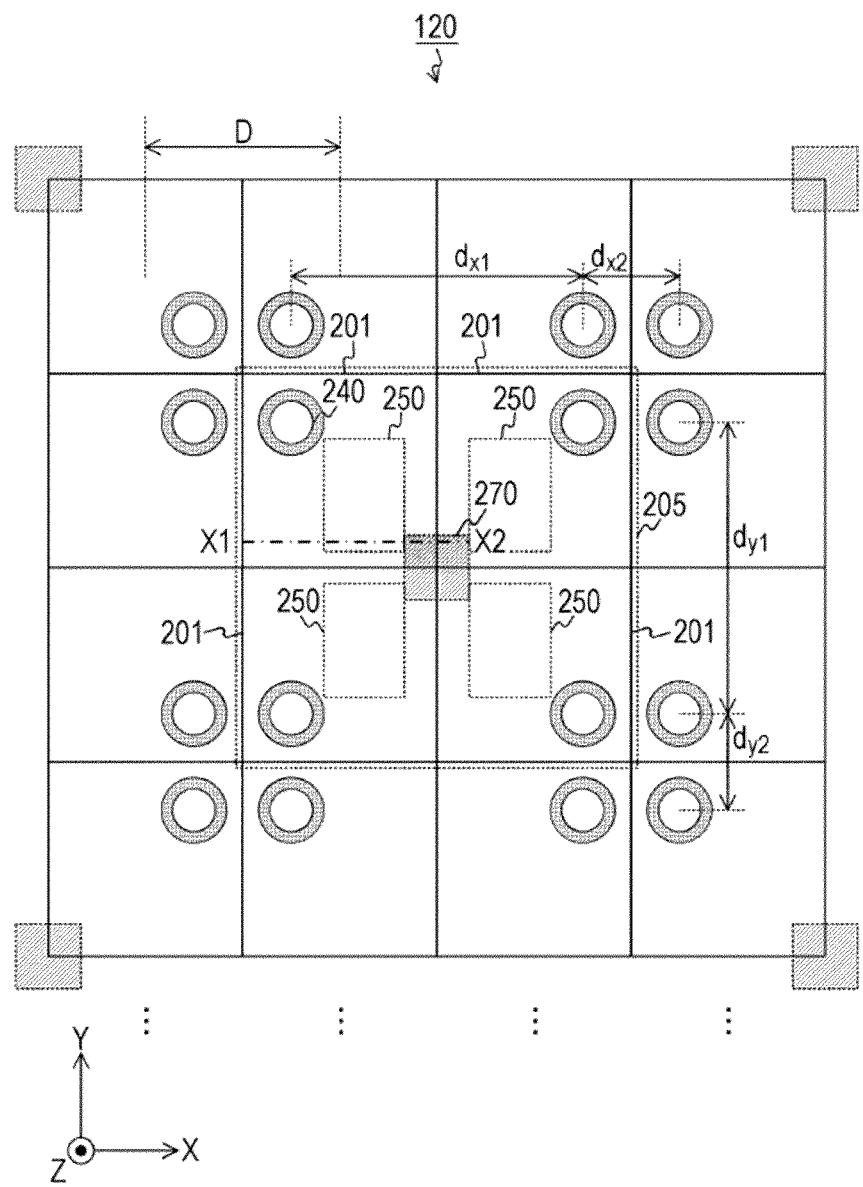

[Fig. 8]
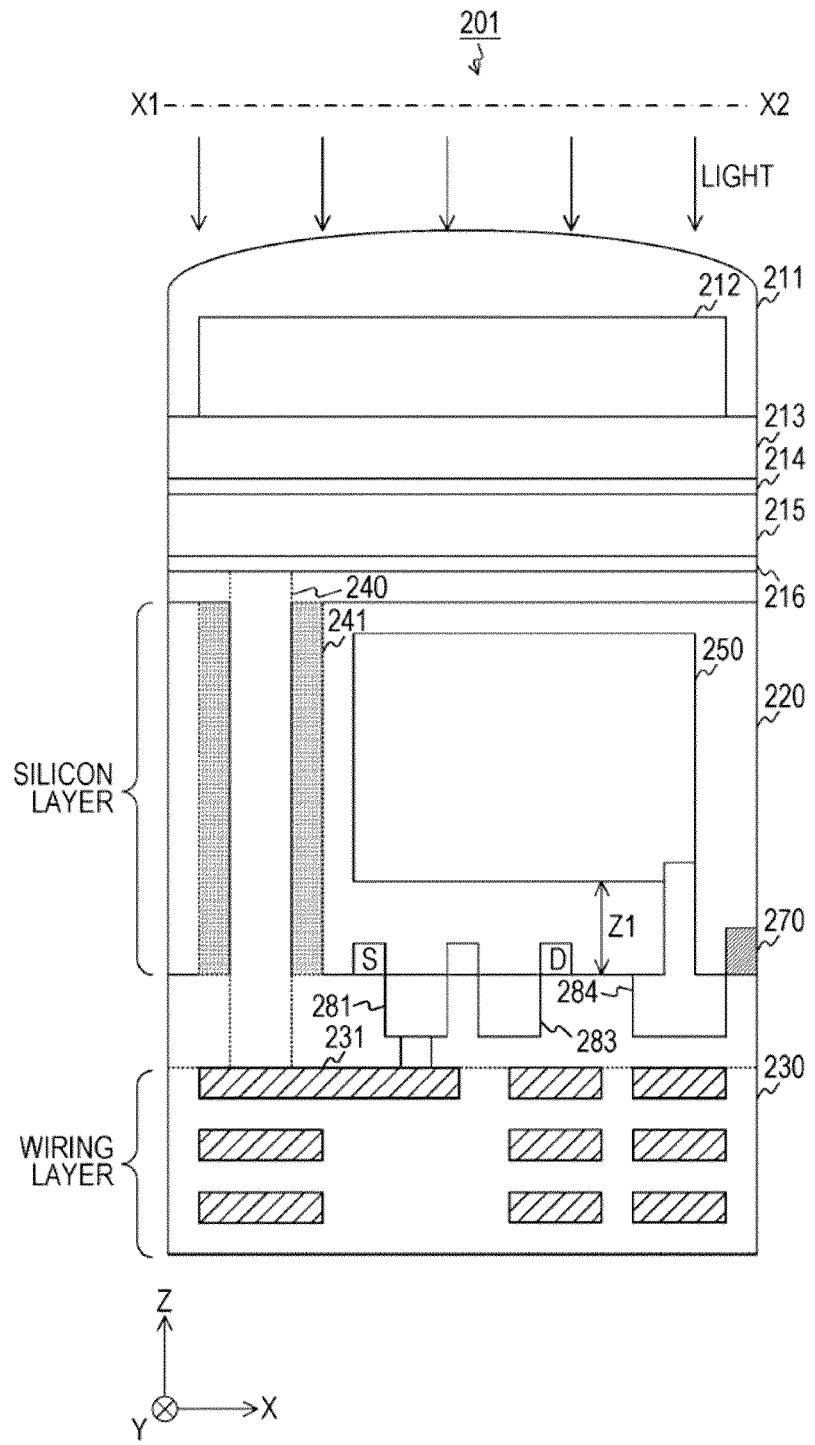

[Fig. 9]
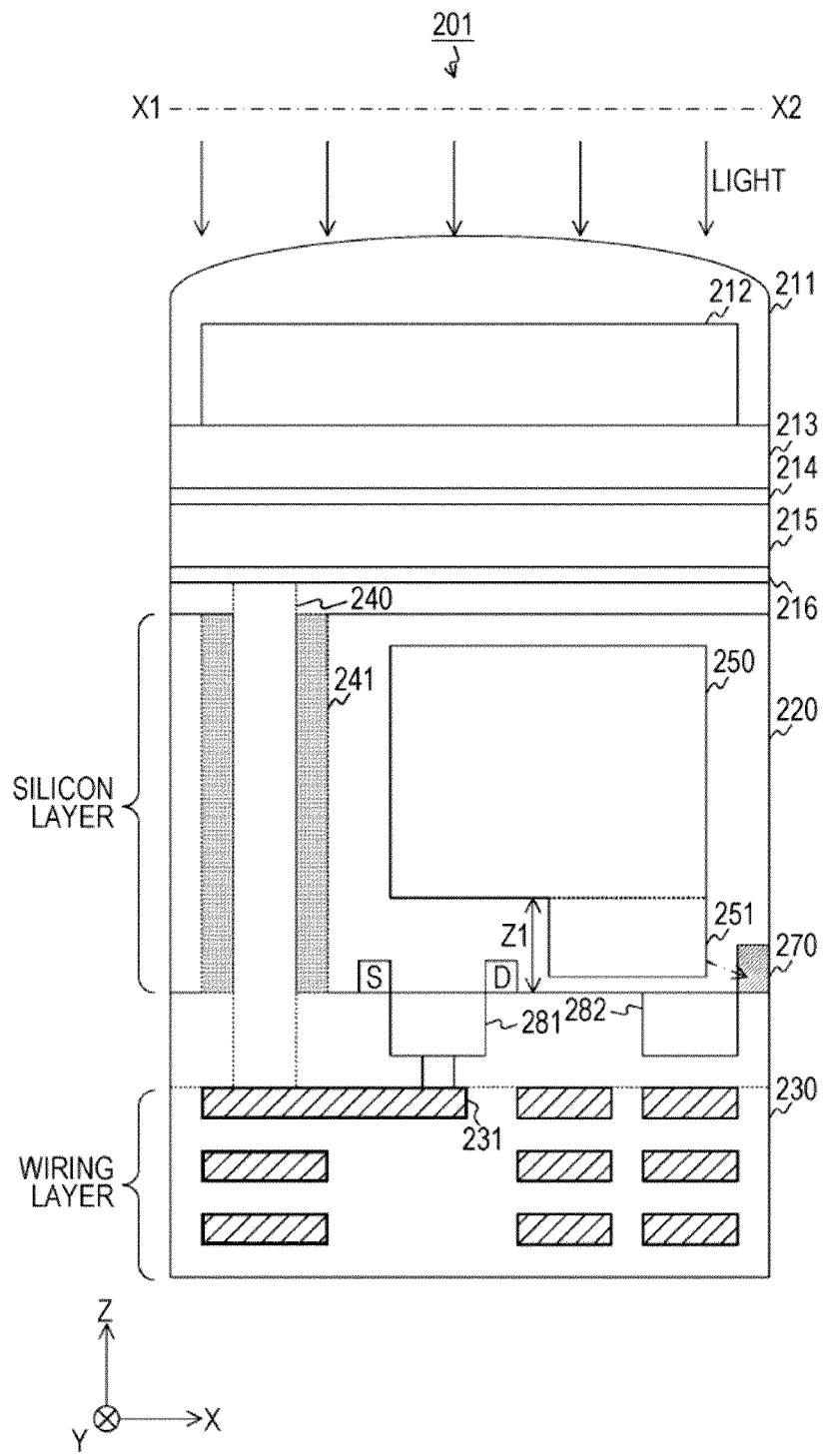

[Fig. 10]
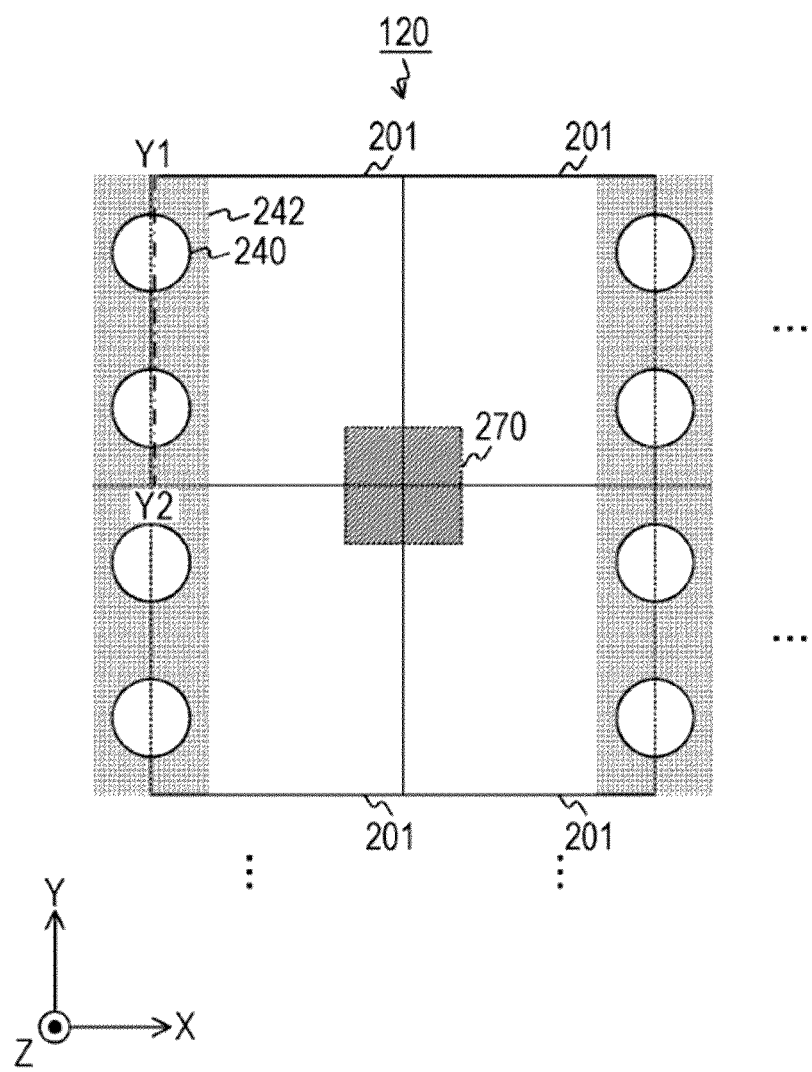

[Fig. 11]
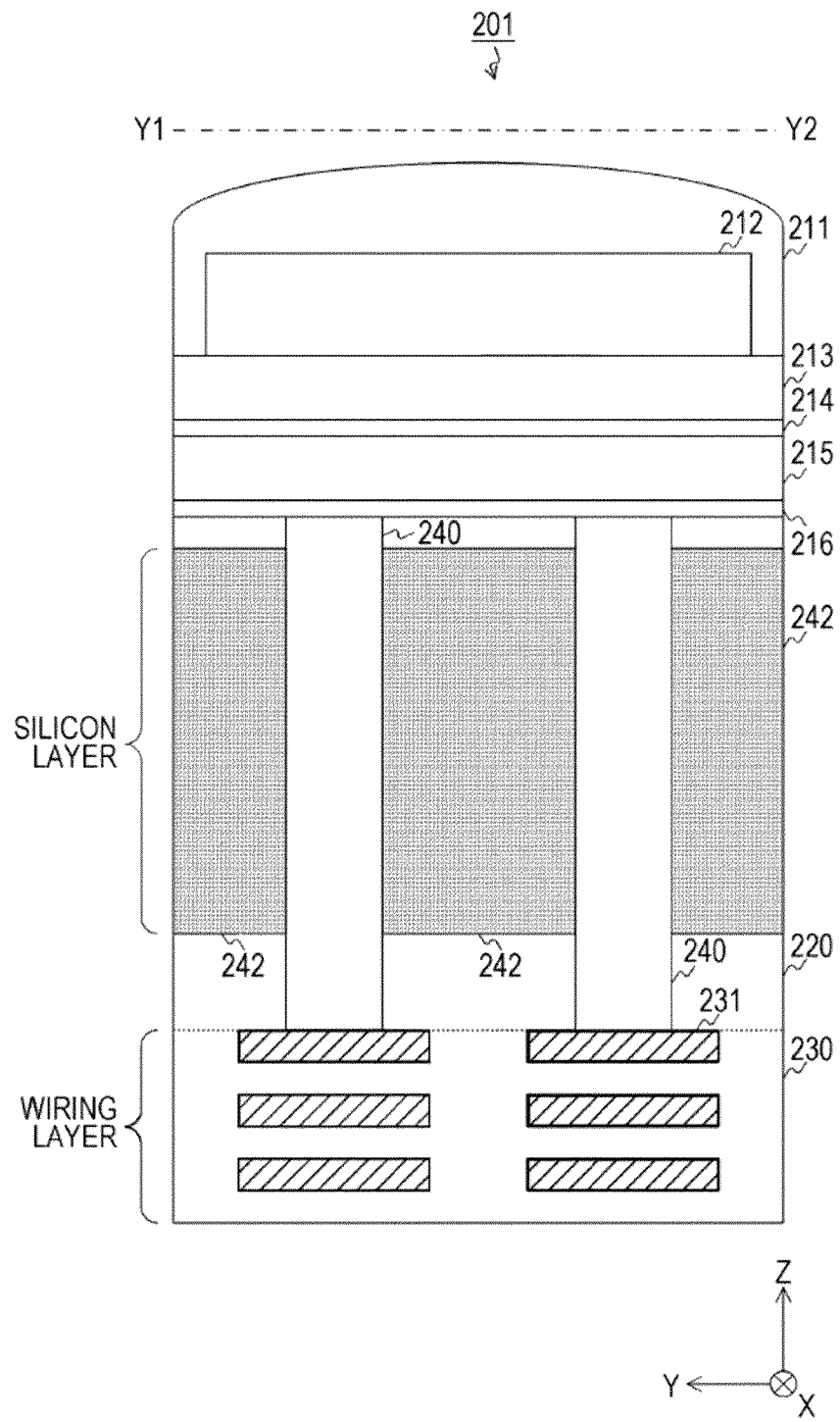

[Fig. 12]
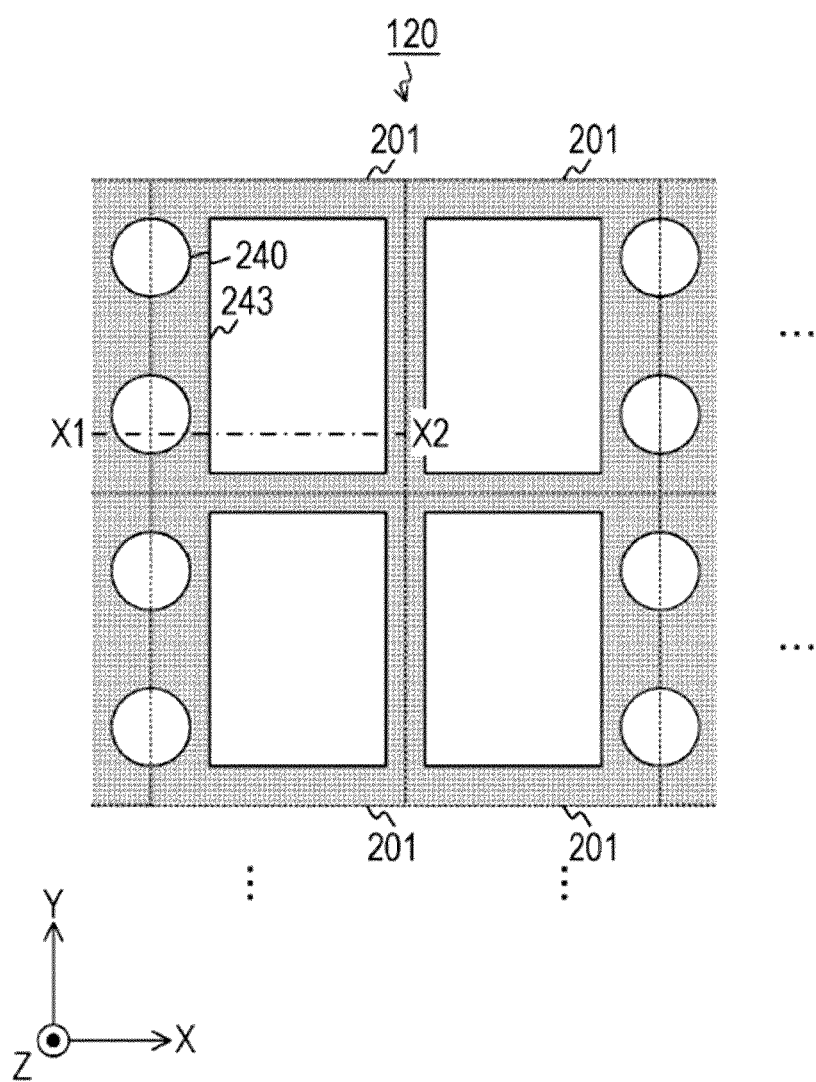

[Fig. 13]
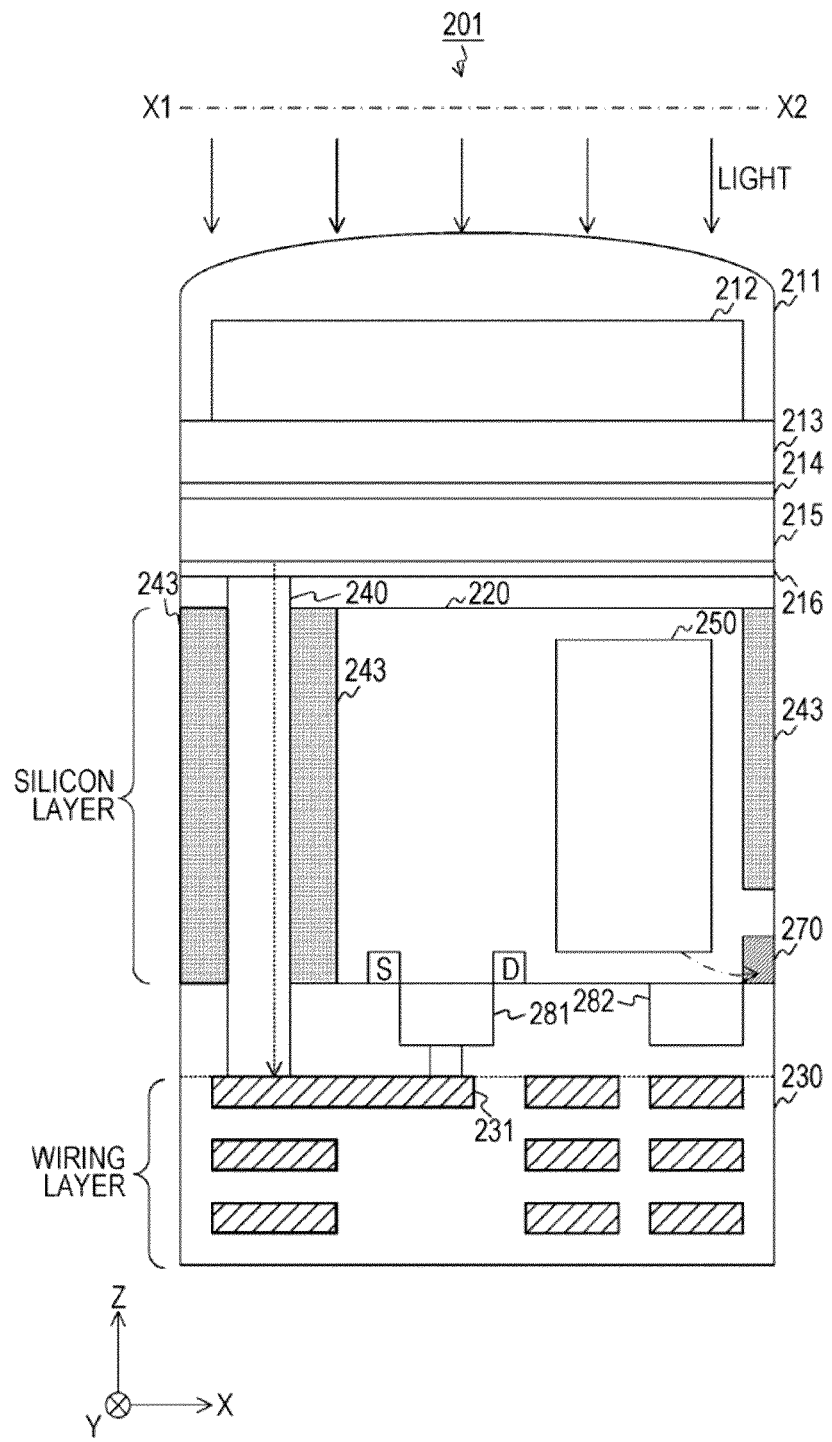

[Fig. 14]
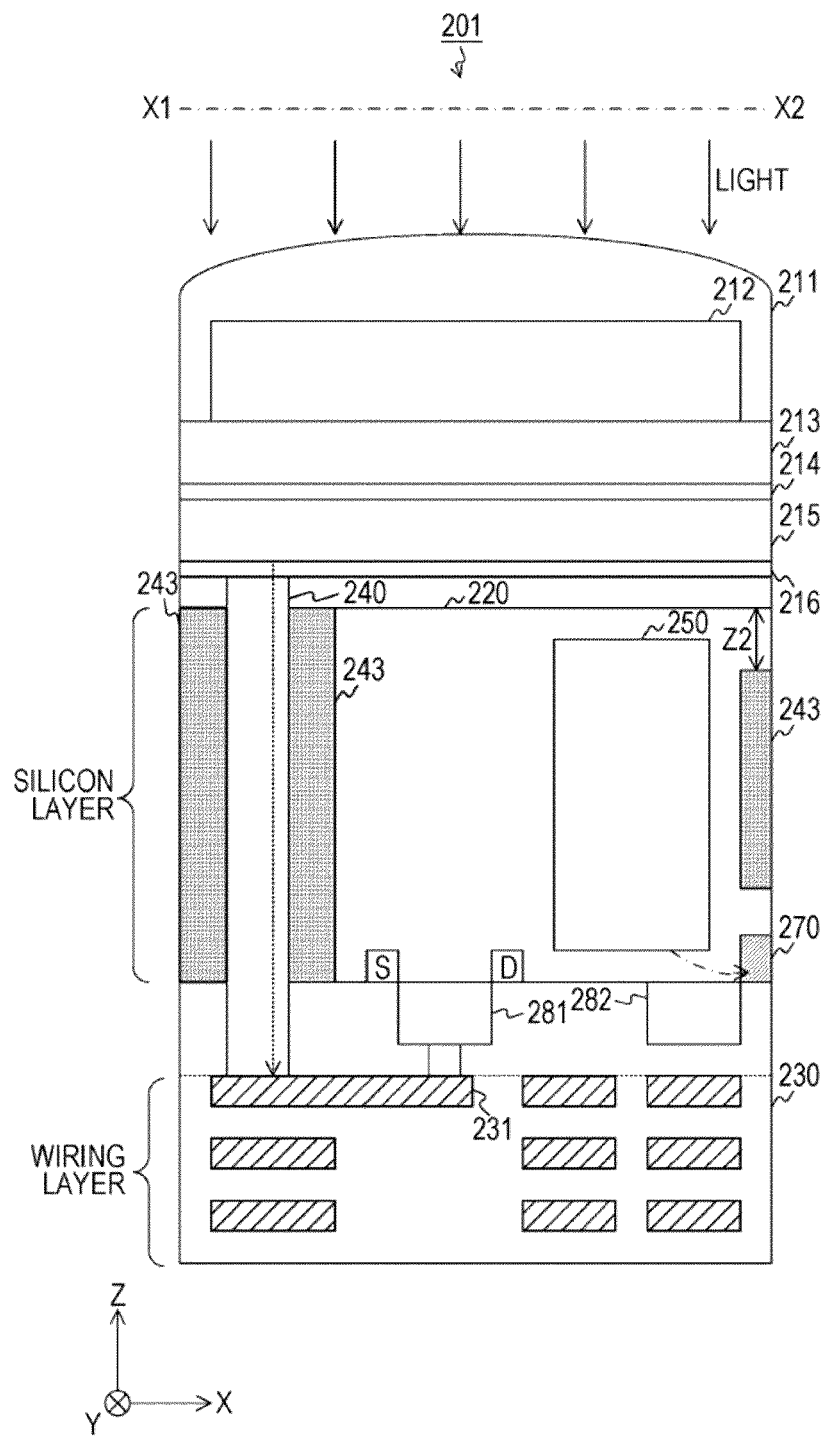

[Fig. 15]
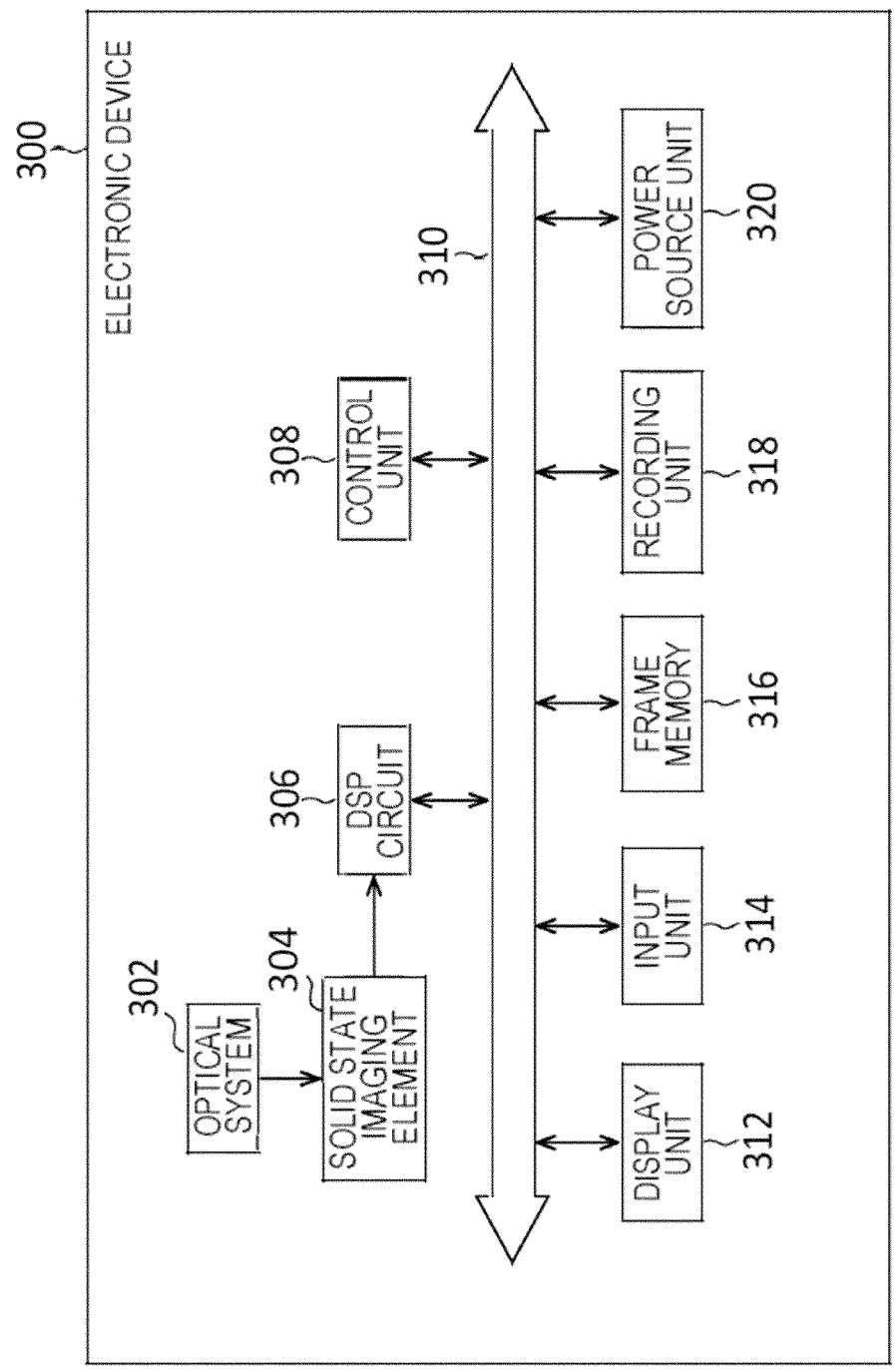

SEMICONDUCTOR DEVICE AND ELECTRONIC APPARATUS

CROSS REFERENCE TO RELATED APPLICATIONS

This application is a national stage application under 35 U.S.C. 371 and claims the benefit of PCT Application No. PCT/JP2016/002000 having an international filing date of 13 Apr. 2016, which designated the United States, which PCT application claimed the benefit of Japanese Patent Application No. 2015-106941 filed, 27 May 2015, the disclosures of which are incorporated herein by reference in their entirety.

TECHNICAL FIELD

The present technique relates to a semiconductor device and an electronic apparatus. More particularly, the present technique relates to a backside-irradiation-type semiconductor device and an electronic apparatus.

BACKGROUND ART

A solid-state image sensor in which pixels are arranged in a two-dimensional lattice to capture images has been used. To improve the resolution of such a solid-state image sensor, a layered pixel structure, in which a photoelectric conversion film and a photodiode are layered, is used. In the layered pixel structure, light having a certain wavelength (e.g., green light) is subject to photoelectric conversion by a photoelectric conversion film, while light having other wavelengths (e.g., red light or blue light) are transmitted through the photoelectric conversion film. The transmitted light is then subject to photoelectric conversion by a photodiode. Photoelectric conversion can be performed for multiple colors of light, whereby the resolution is improved.

To improve sensitivity as well as resolution, a backside-irradiation-type solid-state image sensor, in which the photoelectric conversion film is disposed on a surface (backside) opposite to the surface on which the circuit is disposed in the layered pixel structure, has been proposed (e.g., see PTL 1). In such a solid-state image sensor, a through electrode is provided for each pixel, such that the through electrode penetrates through a silicon layer between the photoelectric conversion film and the circuit surface to transmit an electric signal from the photoelectric conversion film located on the backside to the circuit surface.

CITATION LIST

Patent Literature

PTL 1: JP 2011-29337 A

SUMMARY

Technical Problem

In the prior technique, however, as the pixels are further miniaturized, space between the through electrodes becomes narrower. In that case, a transistor or a floating diffusion layer may not be disposed in the space (narrow space). The miniaturization of pixels, therefore, may be difficult compared to an imaging sensor that does not include the through electrode.

The present technique is provided in view of the above situations and the desirability of facilitating the miniaturization of pixels in a backside-irradiation-type solid-state image sensor.

Solution to Problem

A semiconductor device according to one aspect of the present technology includes: a plurality of pixels arranged in a two-dimensional array, each pixel of the plurality of pixels including: a photoelectric conversion film configured to photoelectrically convert light of a first wavelength and pass light of a second wavelength, and a photoelectric conversion unit configured to photoelectrically convert the light of the second wavelength; a charge storage unit configured to store charge received from the photoelectric conversion unit of each pixel in a pixel group, wherein the pixel group includes adjacent pixels among the plurality of pixels; a plurality of through electrodes, and a wiring layer coupled to the photoelectric conversion film of each pixel of the plurality of pixels by at least one through electrode of the plurality of through electrodes.

An electronic apparatus of one aspect of the present technology includes: an image sensor including a plurality of pixels arranged in a two-dimensional array. Each pixel of the plurality of pixels includes: a photoelectric conversion film configured to photoelectrically convert light of a first wavelength and pass light of a second wavelength, and a photoelectric conversion unit configured to photoelectrically convert the light of the second wavelength. The image sensor further includes a charge storage unit configured to store charge received from the photoelectric conversion unit of each pixel in a pixel group, wherein the pixel group includes adjacent pixels among the plurality of pixels, a plurality of through electrodes, and a wiring layer coupled to the photoelectric conversion film of each pixel of the plurality of pixels by at least one through electrode of the plurality of through electrodes. The electronic apparatus further includes an optical system configured to provide an image on an imaging surface of the image sensor and covert the image into electrical signals.

Advantageous Effects of Invention

According to an embodiment of the present technique, the pixels are easily miniaturized in the backside-irradiation-type imaging sensor. The effects listed herein are not necessarily limited, and only one of the effects disclosed herein may be provided.

BRIEF DESCRIPTION OF DRAWINGS

FIG. 3 is an example of a top view of a pixel array unit of a comparative example.

FIG. 4 is an example of a cross-sectional view of a pixel along the X-axis of the first embodiment.

FIG. 5 is an example of a cross-sectional view of a pixel along the Y-axis of the first embodiment.

FIG. 6 is an example of a top view of a pixel array unit in a variation of the first embodiment.

FIG. 7 is an example of a top view of a pixel array unit of a second embodiment.

FIG. 8 is an example of a cross-sectional view along the X-axis of a third embodiment.

FIG. 9 is an example of a cross-sectional view along the X-axis of a fourth embodiment.

FIG. 10 is an example of a top view of a pixel array unit of a fifth embodiment.

FIG. 11 is an example of a cross-sectional view of a pixel along the Y-axis of a fifth embodiment.

FIG. 12 is an example of a top view of the pixel array unit of a sixth embodiment.

FIG. 13 is an example of a cross section of a pixel along the X-axis of the sixth embodiment.

FIG. 14 is an example of a cross-sectional view of the pixel in the X-axis direction in the sixth embodiment when the depth of an insulating portion is changed.

FIG. 15 is a block diagram for explaining the configuration of an electronic device to which an image sensor according to an embodiment of the present technology is applied.

DESCRIPTION OF EMBODIMENTS

Modes for embodying the present technique (hereinafter referred to as an embodiment) will be described below. The description will be given in the following order:

1. A first embodiment (an example in which through electrodes are disposed at intervals wider than the pixel pitch).

2. A second embodiment (an example in which through electrodes are disposed around corners opposite to a corner where a floating diffusion layer is disposed).

3. A third embodiment (an example in which a buried gate is provided and through electrodes are disposed at intervals wider than the pitch of the pixels).

4. A fourth embodiment (an example in which an ion injection plug is provided and through electrodes are disposed at intervals wider than the pitch of the pixels).

5. A fifth embodiment (an example in which columns are separated from one another by insulating portions and through electrodes are disposed at intervals wider than the pixel pitch).

6. A sixth embodiment (an example in which the pixels are separated from one another by the insulating portions and through electrodes are disposed at intervals wider than the pixel pitch).

1. First Embodiment

Exemplary Structure of Solid-State Image Sensor

Figure 1:
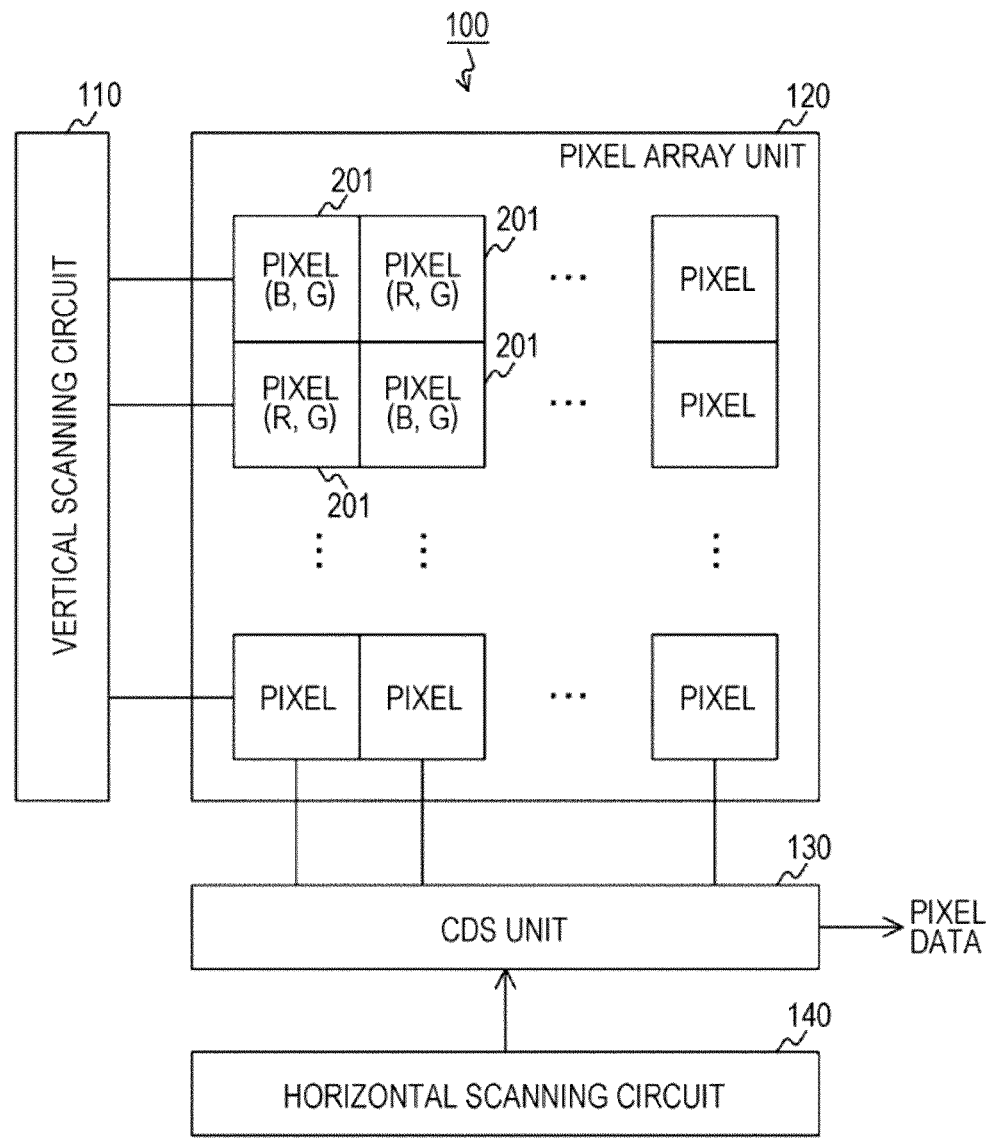
FIG. 1 is a block diagram illustrating an exemplary structure of a solid-state image sensor of a first embodiment.

FIG. 1 is a block diagram illustrating an exemplary structure of a solid-state image sensor 100 of a first embodiment. The solid-state image sensor 100 captures images and includes a vertical scanning circuit 110, a pixel array unit 120, a correlated double sampling (CDS) unit 130, and a horizontal scanning circuit 140. The solid-state image sensor 100 is mounted on various electronic devices, such as a camera or a mobile phone having an image capturing function.

The pixel array unit 120 includes a plurality of pixels 201 arranged in a two-dimensional lattice (array). In the following, the plurality of pixels 201 arranged in a predetermined direction is referred to as a "line," or a row, and the plurality of pixels 201 arranged in a direction perpendicular to the line is referred to as a "column." Each of the pixels 201 photoelectrically converts two types of light having different wavelengths to generate two pixel signals. For example, half of the pixels 201 photoelectrically convert blue light and green light, while the other half of the pixels 201 photoelectrically convert red light and green light.

The vertical scanning circuit 110 sequentially selects lines of the pixel array unit 120 to output pixel signals therefrom. The CDS unit 130 performs correlated double sampling processing in which the CDS unit 130 reads a reset signal corresponding to an initial value of the charge amount and a pixel signal corresponding to the photoelectrically converted charge amount from the pixel array unit 120 in accordance with the control by the horizontal scanning circuit 140, and determines a difference between the reset signal and the pixel signal. The CDS unit 130 outputs an obtained difference signal as pixel data to the outside of the solid-state image sensor 100. The image data formed by the pixel data undergoes various types of image processing, such as demozaic processing and/or white balance processing, by an image processor. The vertical scanning circuit 110 is an example of a scanning circuit. The CDS unit 130 is an example of a processor.

The horizontal scanning circuit 140 sequentially selects the columns of the pixel array unit 120 to cause the CDS unit 130 to read pixel signals.

Exemplary Structure of Pixel Array Unit

Figure 2:
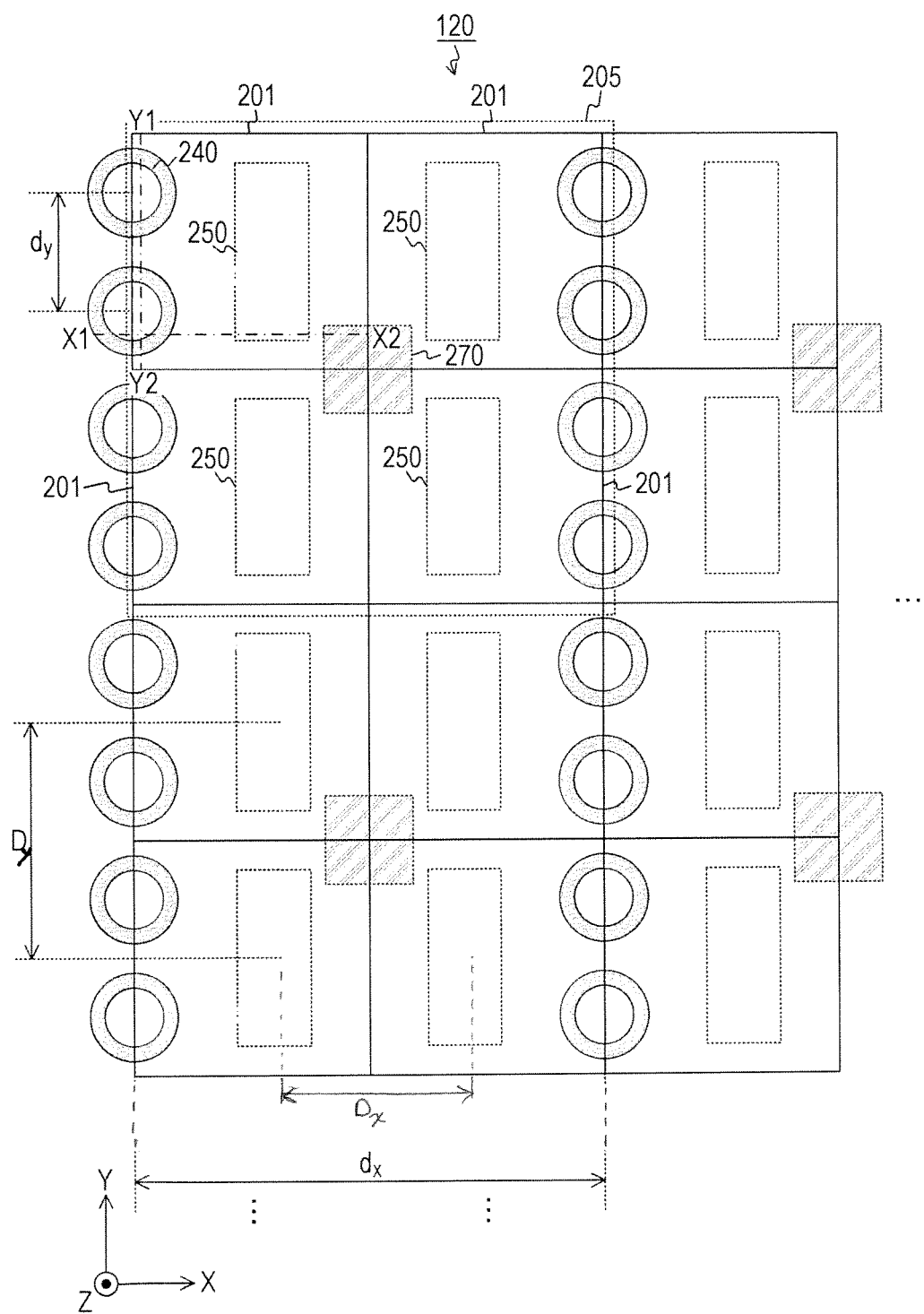
FIG. 2 is an example of a top view of a pixel array unit of the first embodiment.

FIG. 2 is an example of a top view of the pixel array unit 120 in the first embodiment. The top view represents, as an upper surface, one of two surfaces of a silicon layer in the pixel array unit 120 to which light is directed.

In the pixel array unit 120, a plurality of pixel blocks 205 is disposed in a two-dimensional lattice or array. Each block of the pixel blocks 205 includes four pixels 201 arranged in two lines (rows) by two columns. A floating diffusion layer 270 is disposed in the center of each of the pixel blocks 205.

A through electrode 240 is disposed for each pixel 201. Of a pair of pixels 201 adjacent to each other in the line direction (X-axis direction), the through electrode 240 belonging to one of the pixels 201 and the through electrode 240 belonging to the other of the pixels 201 is disposed in a line in the column direction (Y-axis direction). In the drawing, one of the two through electrodes 240 disposed on the border between a pair of adjacent pixels 201 belongs to one pixel of the pair of pixels 201, while the other of the two through electrodes 240 belongs to the other pixel of the pair of pixels 201.

The through electrode 240 is an electrode that penetrates the silicon layer in the Z-axis direction, where the Z-axis direction is perpendicular to the light-receiving surface. A photodiode 250 photoelectrically converts light of a predetermined wavelength (red or blue). Four photodiodes 250 in the pixel block 205 share a floating diffusion layer 270 disposed in the center of the pixel block 205, and the electric charge from the photodiodes 250 is stored in the floating diffusion layer 270. In FIG. 2, grey portions around the through electrodes 240 represent insulating portions that insulate the through electrodes 240 from the surrounding area. The photodiodes 250 do not actually appear on the surface of the silicon layer and are formed inside the silicon layer. In FIG. 2, the photodiodes 250 are indicated by dotted lines on the surface of the silicon layer for convenience of explanation. Other elements, such as transistors, that are provided in addition to the photodiodes 250 are not illustrated in the drawing for convenience of illustration.

The photodiodes 250 are an example of the photoelectric conversion unit recited in the appended claims.

The floating diffusion layer 270 stores the electric charge from the photodiodes 250 and generates an electric signal having a voltage corresponding to the stored charge amount as a pixel signal. The floating diffusion layer 270 does not actually appear on the surface of the silicon layer and is formed inside the silicon layer. In FIG. 2, the photodiodes 250 are indicated by dotted lines on the surface of the silicon layer for convenience of explanation.

Hereinafter, a distance between representative points (e.g., center points) of adjacent pixels 201 is referred to as a "pixel pitch" and a distance between representative points of adjacent through electrodes is referred to as an "electrode pitch."

In a line direction (X-axis direction), an electrode pitch dx of the through electrodes 240 is set to be wider than a pixel pitch $D_x$. In a column direction (Y-axis direction), an electrode pitch $d_y$ is set to be narrower than the pixel pitch D.

Since the through electrodes 240 are disposed at the electrode pitch $d_x$ that is wider than the pixel pitch $D_x$ in the X-axis direction, the floating diffusion layer 270 shared by the pixels 201, or transistors with which a pixel circuit is formed, is disposed in a space provided by such a wide electrode pitch $d_x$.

FIG. 3 is an example of the top view of the pixel array unit of a comparative example. In the comparative example, the through electrodes are arranged at an electrode pitch equivalent to the pixel pitch in both the X-axis and Y-axis directions. In this arrangement, as illustrated in the drawing, the distance between the through electrodes in the X-axis direction is narrower than that of FIG. 2, and the floating diffusion layer shared by four pixels is not able to be disposed.

In contrast, in the solid-state image sensor 100, the through electrodes 240 are disposed at the electrode pitch dx that is wider than the pixel pitch D in the pixel block 205, whereby the floating diffusion layer 270 shared by four pixels is able to be disposed among the through electrodes 240. Unlike the comparative example, the floating diffusion layer 270 is shared by a plurality of pixels.

Exemplary Structure of Pixels

FIG. 4 is an example of a cross-sectional view of the pixel 201 along a line between X1 and X2 of the first embodiment. As illustrated in the drawing, the pixel 201 includes a microlens 211, a color filter 212, a passivation layer 213, an upper electrode 214, a photoelectric conversion film 215, and a lower electrode 216. The pixel 201 also includes a silicon layer 220, a wiring layer 230, a through electrode 240, an amplifier transistor 281, and a transfer transistor 282. The silicon layer 220 includes an insulating portion 241, a photodiode 250, and a floating diffusion layer 270. The wiring layer 230 includes a plurality of wires 231.

The wiring layer 230 is formed on one of two surfaces of the silicon layer 220, and light is directed to a surface (a so-called "backside") opposite to the surface of the wiring layer 230. The solid-state image sensor 100 in which the light is directed to the backside is called a backside-irradiation-type imaging sensor. A direction from the wiring layer 230 toward the backside is referred to as an upward direction hereinafter.

A lower electrode 216 is layered on the silicon layer 220, and the photoelectric conversion film 215 is layered on the lower electrode 216. An upper electrode 214 is layered on the photoelectric conversion film 215, and the passivation layer 213, which protects the photoelectric conversion film 215 or the like, is layered on the upper electrode 214. The color filter 212 is provided on the passivation layer 213, and the microlens 211 is provided above the color filter 212.

The through electrode 240 penetrates through the silicon layer 220 to connect the lower electrode 216 with the wires 231. In the silicon layer 220, an insulating portion 241 is formed around the through electrode 240.

The microlens 211 collects incident light. The color filter 212 transmits light having a specific wavelength among light having differing wavelengths that come from the microlens 211. As the color filter 212, a filter that transmits mixed light, to which photoelectric conversion is performed by the photoelectric conversion film 215 and the photodiode 250, is used. For example, if the photoelectric conversion film 215 and the photodiode 250 are made to photoelectrically convert green light and red light, respectively, the color filter 212 that transmits yellow light that is obtained by mixing the green light and the red light is used. If the photoelectric conversion film 215 and the photodiode 250 are made to photoelectrically convert green light and blue light, the color filter 212 that transmits cyan obtained by mixing the green light and the blue light is used.

The color filter 212 is disposed over the passivation layer 213, but the structure is not limited thereto. For example, the color filter 212 may be disposed between the lower electrode 216 and the photodiode 250. In this case, a filter that transmits primary color light (e.g., red or blue) that the photodiode 250 is made to photoelectrically convert is used as the color filter 212. The color filter 212 is provided on the entire surface of the pixels 201, but the color filter 212 may not be provided over a part (e.g., half) of the pixels. When the color filter 212 is not provided on the pixels 201, such pixels 201 are used as pixels that photoelectrically convert white light.

The photoelectric conversion film 215 photoelectrically converts light having a predetermined wavelength (e.g., green light) among the light transmitted through the color filter 212, while transmitting light having other wavelengths. The electric signal obtained by photoelectric conversion by the photoelectric conversion film 215 is transmitted to the wiring layer 230 via the through electrode 240.

The electric charge obtained by photoelectric conversion by the photoelectric conversion film 215 is stored in another floating diffusion layer different from the floating diffusion layer 270. Such a floating diffusion layer corresponding to the photoelectric conversion film 215 does not appear on the cross-sectional view illustrated in FIG. 4.

The amplifier transistor 281 amplifies the electric signal generated by the floating diffusion layer corresponding to the photoelectric conversion film 215, and outputs an obtained electric signal as a pixel signal. In the pixel 201, a selection transistor that outputs the pixel signal from the amplifier transistor 281 in accordance with a control signal from the vertical scanning circuit 110 is further provided, but such a selection transistor or other elements are not illustrated in FIG. 4 for convenience of illustration.

The photodiode 250 photoelectrically converts the light (e.g., red light) transmitted through the color filter 212 and the photoelectric conversion film 215. The photodiode 250 is provided directly above the transfer transistor 282. The photodiodes 250 are an example of the photoelectric conversion unit recited in the appended claims.

The transfer transistor 282 transfers the electric charge obtained by photoelectric conversion by the photodiode 250 to the floating diffusion layer 270 in accordance with a control signal from the vertical scanning circuit 110. The floating diffusion layer 270 stores the electric charge after photoelectric conversion by the photodiode 250 to generate the electric signal corresponding to the charge amount. The floating diffusion layer 270 is an example of the charge storage unit recited in the appended claims.

The amplifier transistor, which amplifies the electric signal generated by the floating diffusion layer 270, and the selection transistor, which outputs the signal from the amplifier transistor in accordance with the control signal, are provided in one of the four pixels 201 in the pixel block 205. In FIG. 4, however, such transistors are not illustrated.

FIG. 5 is an example of a cross section of the pixel 201 along the line between Y1 and Y2 of the first embodiment. As illustrated in the drawing, two through electrodes 240 are disposed in the Y-axis direction and extend in the Z-axis direction to penetrate through the silicon layer 220.

According to the first embodiment of the present technique, the through electrodes 240 are arranged at the electrode pitch wider than the pixel pitch in the X-axis direction, and the floating diffusion layer is disposed between the through electrodes 240 and shared by the four pixels. It is, therefore, possible to reduce the number of the floating diffusion layers compared to the case when the floating diffusion layer is not shared by the pixels. As a result of this, the pixels are easily miniaturized.

Modification

In the first embodiment described above, the electrode pitch is wider than the pixel pitch in the line direction (X-axis direction) in which the vertical scanning circuit 110 sequentially selects the line. In contrast, the electrode pitch may be wider than the pixel pitch in the column direction (Y-axis direction) perpendicular to the line direction. As a variation of the first embodiment, the solid-state image sensor 100 differs from that of the first embodiment in that the through electrodes 240 are disposed at an electrode pitch that is wider than the pixel pitch in the Y-axis direction.

FIG. 6 is an example of the top view of the pixel array unit 120 in the variation of the first embodiment. The solid-state image sensor 100 of the variation differs from that of the first embodiment in that an electrode pitch dy' is wider than the pixel pitch D in the Y-axis direction. An electrode pitch dx' in the X-axis direction is set to be narrower than the pixel pitch D.

According to the variation of the first embodiment, the through electrodes 240 are disposed at an electrode pitch that is wider than the pixel pitch in the Y-axis direction, and the floating diffusion layer is disposed between the through electrodes 240 to be shared by the four pixels. It is, therefore, possible to share the floating diffusion layer amongst a plurality of pixels.

2. Second Embodiment

In the first embodiment, the through electrodes 240 are disposed at an electrode pitch that is narrower than the pixel pitch in the Y-axis direction. This may cause difficulty in disposing transistors or the like among the through electrodes 240 in the Y-axis direction. It is desirable to increase the electrode pitch in the Y-axis direction as well. The solid-state image sensor 100 of a second embodiment differs from that of the first embodiment in that the electrode pitch is increased in the Y-axis direction as well as the X-axis direction.

FIG. 7 is an example of the top view of the pixel array unit 120 in the second embodiment. The pixel array unit 120 of the second embodiment differs from that of the first embodiment in that the floating diffusion layer 270 is disposed at one of opposite corners of the pixel 201, while four through electrodes 240 are disposed around the other corner of the opposite corners. In this arrangement, both an electrode pitch dx1 in the X-axis direction and an electrode pitch dy1 in the Y-axis direction in the pixel block 205 are wider than the pixel pitch D. Electrode pitches dx2 and dy2, which are the electrode pitches between the through electrodes 240 provided around corners of the pixel 201, are set to be narrower than the pixel pitch D. Since the electrode pitch dy1 in the Y-axis direction in the pixel block 205 is wider than the pixel pitch D, the transistors or the like are able to be disposed between the through electrodes 240 in the Y-axis direction, whereby miniaturization of the pixels is facilitated.

According to the second embodiment of the present technique, the floating diffusion layer 270 is disposed at one of the opposite corners of the pixel 201 and the four through electrodes 240 are disposed around the other of the opposite corners. It is, therefore, possible to increase the electrode pitch in the pixel block in both the X-axis and Y-axis directions.

3. Third Embodiment

In the first embodiment described above, the photodiode 250 is formed directly above the transfer transistor 282. In this structure, there is only a small space secured under the photodiode 250, and elements other than the transfer transistor 282 are not able to be disposed. The solid-state image sensor 100 of a third embodiment differs from that of the first embodiment in that the space under the photodiode 250 is enlarged.

FIG. 8 is an example of a cross-sectional view of the pixel 201 along a line between X1 and X2 of the third embodiment. The pixel 201 of the third embodiment differs from that of the first embodiment in that a transfer transistor 284 is provided instead of the transfer transistor 282 and a selection transistor 283 is further provided in the cross-sectional view along the line between X1 and X2. A layout of the top view of the pixel array unit 120 of the third embodiment is similar to that of the second embodiment illustrated in FIG. 7.

The transfer transistor 284 differs from the transfer transistor 282 of the first embodiment in that a buried gate region buried inside the silicon layer 220 is provided.

The photodiode 250 of the third embodiment is disposed away from the transfer transistor 284 by a distance Z1 corresponding to the length of the buried gate region. The photodiode 250 can be formed to span over the transfer transistor 284 and the through electrode 240 in the X-axis direction. As a result of this, spare space is secured under the photodiode 250 such that the selection transistor 283 or the like can further be disposed in the space.

The layout of the top view of the pixel array unit 120 of the third embodiment is similar to that of the second embodiment, as mentioned above, such that the buried gate region and the through electrode 240 are located at opposite corners. It is, therefore, possible to suppress capacitance coupling between the through electrodes 240 and the buried gate electrode 240, to thereby restrict interference by the signal from the through electrodes 240.

According to the third embodiment, the gate region of the transfer transistor 284 is buried in the silicon layer to dispose the photodiode 250 away from the transfer transistor 284, to thereby increase the space under the photodiode 250. The spare space is generated, and the elements, such as transistors, can further be disposed.

4. Fourth Embodiment

In the first embodiment described above, the photodiode 250 is formed directly above the transfer transistor 282. In this structure, there is only a small space secured under the photodiode 250, and elements other than the transfer transistor 282 are not able to be disposed in such space. The solid-state image sensor 100 of a fourth embodiment differs from that of the first embodiment in that the space under the photodiode 250 is enlarged. A layout of the top view of the pixel array unit 120 of the fourth embodiment is similar to that of the second embodiment illustrated in FIG. 7.

FIG. 9 is an example of a cross-sectional view of the pixel 201 along the line between X1 and X2 in the fourth embodiment. The pixel 201 of the fourth embodiment differs from that of the first embodiment in that an ion injection plug 251 is formed on the photodiode 250 on the side of the wiring layer 230.

The ion injection plug 251 is a high density semiconductor region formed by injecting ions multiple times by changing an acceleration voltage from the side of the surface of the silicon layer 220. The electric charge generated in the photodiode 250 is transferred to the floating diffusion layer 270 via the ion injection plug 251 and the transfer transistor 282.

The photodiode 250 of the fourth embodiment is disposed away from the transfer transistor 282 by a distance Z1 corresponding to the length of the ion injection plug 251 in the Z-axis direction. The photodiode 250 may be formed to span over the transfer transistor 282 and the through electrode 240 in the X-axis direction. As a result of this, spare space is secured under the photodiode 250 such that the transfer transistor 282 or the like can further be disposed in the space.

The layout of the top view of the pixel array unit 120 of the fourth embodiment is similar to that of the second embodiment, as mentioned above, such that the ion injection plug 251 and the through electrodes 240 are located at opposite corners. It is, therefore, possible to restrict the interference between the signal from the through electrodes 240 and the signal from the photodiode 250.

According to the fourth embodiment, the ion injection plug 251 is formed on the side of the wiring layer 230 of the photodiode 250, and the space under the photodiode 250 is enlarged. The spare space is generated and the elements, such as transistors, can further be disposed.

5. Fifth Embodiment

The insulating portion 241 is only formed around the through electrode 240 in the first embodiment. In this structure, the region of the insulating portion 241 becomes narrower as the pixels 201 are further miniaturized, whereby manufacturing may become difficult. The solid-state image sensor 100 of a fifth embodiment differs from that of the first embodiment in that the insulating portion 241 is easily formed.

FIG. 10 is an example of the top view of the pixel array unit 120 in the fifth embodiment. The pixel array unit 120 of the fifth embodiment differs from that of the first embodiment in that an insulating portion 242 is formed instead of the insulating portion 241.

The insulating portion 242 insulates the columns of the pixels 201 from one another. The insulating portion 242 is formed in the column direction (Y-direction) of the pixels 201 on one of two sides of the column of the pixels 201 opposite to the side where the floating diffusion layer 270 is provided. The insulating portion 242 for each of the pixels 201, which are arranged in the column direction, is shared in this structure. The insulating portion 242 is an example of the inter-line insulating portion.

The through electrode 240 of the fifth embodiment extends from the photoelectric conversion film 215 to penetrate through the insulating portion 242 and is connected to the wiring layer 230.

Since the insulating portion 242 is formed in the column direction, the region of the insulating portion is increased and is easily miniaturized compared to the first embodiment in which the insulating portion 241 is formed only around the through electrode 240. Meanwhile, a manufacturing apparatus of the solid-state image sensor 100 collectively produces the insulating portion 242 for each column of the pixels 201. It is, therefore, possible to reduce the number of steps of producing the insulating portion compared to the first embodiment in which the insulating portion 241 is formed for each of the through electrodes 240. The insulating portion 242 completely separates adjacent columns from one another, and mixture of colors in the adjacent columns is restricted.

FIG. 11 is an example of a cross-sectional view of the pixel 201 along the line between Y1 and Y2 of the fifth embodiment. As illustrated in the drawing, the insulating portions 242 are formed in the column direction (Y-axis direction). The through electrodes 240 extend from the photoelectric conversion film 215 to penetrate through the insulating portion 242 and are connected to the wiring layer 230.

According to the fifth embodiment of the present technique, the insulating portion 242 is formed in the column direction and the through electrode 240 is provided to penetrate through the insulating portion 242. Accordingly, the ease of manufacturing is increased as opposed to the first embodiment in which the insulating portion is only formed around the through electrode 240.

6. Sixth Embodiment

The insulating portion 241 is only formed around the through electrode 240 in the first embodiment. In this structure, the region of the insulating portion 241 becomes narrower as the pixels 201 are further miniaturized, whereby manufacturing may become difficult. The solid-state image sensor 100 of the sixth embodiment differs from that of the first embodiment in that the manufacturing of the insulating portion 241 is more easily facilitated.

FIG. 12 is an example of the top view of the pixel array unit 120 in the sixth embodiment. The pixel array unit 120 of the sixth embodiment differs from that of the first embodiment in that an insulating portion 243 is formed instead of the insulating portion 241.

The insulating portion 243 insulates the pixels 201 from one another. The insulating portion 243 is formed along the border between adjacent pixels 201. The through electrode 240 of the sixth embodiment extends from the photoelectric conversion film 215 and penetrates through the insulating portion 243 to be connected to the wiring layer 230. The insulating portion 243 also insulates the through electrodes 240, as well as the pixels 201, from each other. The insulating portion 243 is an example of the inter-pixel insulating portion recited in the appended claims.

Since the insulating portion 243 is formed along the border between the adjacent pixels, the region where the insulating portion 241 is formed increases and is easily miniaturized compared to the first embodiment in which the insulating portion 241 is formed only around the through electrodes 240. A manufacturing apparatus of the solid-state image sensor 100 collectively produces the insulating portion 243 that separates the through electrodes 240 and the pixels 201 from one another. It is, therefore, possible to reduce the number of steps of forming the insulating portions compared to the structure in which the insulating portion for separating the pixels and the insulating portion for separating the through electrodes are produced separately. The insulating portion 243 is formed around the pixels 201 to completely separate the adjacent pixels 201 from one another such that the mixture of colors in the adjacent pixels 201 is restricted.

FIG. 13 is an example of a cross-sectional view of the pixel 201 along the line between X1 and X2 in the sixth embodiment. In the X-direction, the insulating portion 243 is formed on both sides of the photodiode 250. The floating diffusion layer 270 is formed in the lower portion of the one side of the photodiode 250, while the through electrode 240 is formed on the other side of the photodiode 250.

A portion of the insulating portion 243 located above the floating diffusion layer 270 is formed between the surface on the side of the light-receiving surface of the silicon layer 220 and the floating diffusion layer 270 in the Z-axis direction. As illustrated in FIG. 14, this portion of the insulating portion 243 may be formed between the floating diffusion layer 270 and a position at a fixed depth Z2 from the surface on the side of the light-receiving surface of the silicon layer 220. Other elements are able to be further disposed above the insulating portion 243, such that an area efficiency of the surface that is in parallel with the light-receiving surface is improved.

According to the sixth embodiment of the present technique, the insulating portion 243 that insulates the pixels 201 from one another, and the through electrode 240 that penetrates through the insulating portion 243 is provided to penetrate through the insulating portion 243. It is, therefore, possible to facilitate the manufacturing as opposed to the first embodiment in which the insulating portion is only formed around the through electrodes 240.

<Configuration of Electronic Device>

Subsequently, the configuration of an electronic device to which a photoelectric conversion element according to an embodiment of the present technology is applied will be described with reference to FIG. 15. FIG. 15 is a block diagram for explaining the configuration of an electronic device to which an image sensor, such as image sensor 100, according to an embodiment of the present technology is applied.

As shown in FIG. 15, the electronic device 300 includes an optical system 302, an imaging element 304, a Digital Signal Processor (DSP) circuit 306, a control unit 308, an output unit 312, an input unit 314, a frame memory 316, a recording unit 318, and a power source unit 320.

In this regard, the DSP circuit 306, the control unit 308, the output unit 312, the input unit 314, the frame memory 316, the recording unit 318, and the power source unit 320 are interconnected through a bus line 310.

The optical system 302 takes in incident light from an object, and provides an image on an imaging surface of the imaging element 304, where the imaging element 304 may be the same as or similar to the image sensor 100. In addition, the imaging element 304 includes a photoelectric conversion element according to an embodiment of the present technology, and converts incident light of the image provided on the imaging surface by the optical system 302, into electrical signals on a pixel-to-pixel basis, and outputs the signals as pixel signals.

The DSP circuit 306 processes the pixel signals transferred from the imaging element 304, and outputs the signals to the output unit 312, the frame memory 316, and the recording unit 318, etc. The control unit 308 is configured to have, for example, an arithmetic processing circuit or the like, and controls the operation for each component of the electronic device 300.

The output unit 312 is a panel display device such as a liquid crystal display or an organic electroluminescence display, which displays moving images or static images taken by the imaging element 304. It is to be noted that the output unit 312 may include an audio output device such as a speaker and a headphone. In addition, the input unit 314 is, for example, a device for a user inputting an operation, such as a touch panel and a button, which gives operation instructions for various functions of the electronic device 400 in accordance with the user operation.

The frame memory 316 temporarily stores moving images or static images, etc. taken by the image element 304. In addition, the recording unit 318 records moving images or static images, etc. taken by the image element 304, on a removable storage medium such as a magnetic disk, an optical disk, a magneto optical disk, or a semiconductor memory.

The power source unit 320 appropriately supplies various types of power sources that serve as power sources for the operation of the DSP circuit 306, the control unit 308, the output unit 312, the input unit 314, the frame memory 316, and the recording unit 318, to the objects to be supplied.

The electronic device 300 to which an image sensor according to an embodiment of the present technology is applied has been described above. The electronic device 300 to which the photoelectric conversion element according to an embodiment of the present technology is applied may be, for example, an image sensor 100.

The embodiments described above are only examples for realizing the present technique, and matters included in the embodiments are respectively in correspondence with matters used to identify the present disclosure in the range of the appended claims. Similarly, the matters used to identify the present disclosure in the range of the appended claims are respectively in correspondence with the matters of the embodiments having the same names as those of the matters used to define the present disclosure in the scope of the appended claims. However, the present technique is not limited to the embodiments described above, and may, therefore, be realized by providing various variations to the embodiment insofar as they do not depart from the scope of the technique.

The effects listed herein are not necessarily limited, and only one of the effects disclosed herein may be provided.

The present technique may also be provided in the following structure:

(1) A solid-state image sensor, including:
a photoelectric conversion film,
a photoelectric conversion unit,
a charge storage unit,
a plurality of through electrodes, and
a wiring layer, wherein the photoelectric conversion film photoelectrically converts light having a predetermined wavelength in each of a plurality of pixels arranged in a two-dimensional lattice, while transmitting light having a wavelength different from the predetermined wavelength, the photoelectric conversion unit photoelectrically converts light transmitted through the photoelectric conversion film in each of the pixels, the charge storage unit stores electric charge obtained by photoelectric conversion by the photoelectric conversion unit in each of a predetermined number of pixels in a pixel block, the pixel block including the predetermined number of adjacent pixels among the plurality of pixels, the through electrodes are arranged at intervals wider than a pixel pitch of the predetermined number of pixels in the pixel block, and the wiring layer is connected to the photoelectric conversion film via the plurality of through electrodes.

(2) The solid-state image sensor recited in (1) above, further including:

a scanning circuit configured to sequentially select a plurality of lines, each line including the pixels arranged in a predetermined scanning direction.

(3) The solid-state image sensor as recited in (2) above, wherein the through electrodes are arranged at intervals wider than the pixel pitch in the predetermined scanning direction.

(4) The solid-state image sensor as recited in (2) above, wherein the through electrodes are arranged at intervals wider than the pixel pitch in a direction perpendicular to the predetermined scanning direction.

(5) The solid-state image sensor as recited in (1) above, wherein the charge storage unit is disposed at one of opposite corners of each of the plurality of pixels, and the through electrodes are provided around the other corner of the opposite corners.

(6) The solid-state image sensor as recited in any one of (1) to (5) above, further including:

a transfer transistor configured to transfer the electric charge to the charge storage unit from the photoelectric conversion unit, wherein the photoelectric conversion unit is provided in a silicon layer, and the transfer transistor has a buried gate region buried inside the silicon layer.

(7) The solid-state image sensor as recited in any one of (1) to (6) above, further including:

an ion injection plug formed on the side of the wiring layer of the photoelectric conversion unit.

(8) The solid-state image sensor as recited in any one of (1) to (7) above, further including:

an inter-line insulating portion configured to insulate a plurality of lines from one another, each line including the pixels arranged in a predetermined direction, wherein the through electrodes extend from the photoelectric conversion film to penetrate through the inter-line insulating portion and are connected to the wiring layer.

(9) The solid-state image sensor as recited in any one of (1) to (8) above, further including:

an inter-pixel insulating portion configured to insulate the plurality of pixels from one another, wherein the through electrodes penetrate through the inter-pixel insulating portion and are connected to the photoelectric conversion film and the wiring layer.

(10) An imaging device, including:

a photoelectric conversion film, a photoelectric conversion unit, a charge storage unit, a plurality of through electrodes, a wiring layer, and a processor, wherein the photoelectric conversion film photoelectrically converts light having a predetermined wavelength in each of a plurality of pixels arranged in a two-dimensional lattice, while transmitting light having a wavelength different from the predetermined wavelength, the photoelectric conversion unit photoelectrically converts light transmitted through the photoelectric conversion film in each of the pixels, the charge storage unit stores electric charge obtained by photoelectric conversion by the photoelectric conversion unit in each of a predetermined number of pixels in a pixel block, the pixel block including the predetermined number of adjacent pixels among the plurality of pixels, the through electrodes are arranged at intervals wider than a pixel pitch of the predetermined number of pixels in the pixel block, the wiring layer is connected to the photoelectric conversion film via the through electrodes, and the processor is configured to process a pixel signal having a voltage corresponding to the stored charge amount.

(11) A semiconductor device, comprising:

a plurality of pixels arranged in a two-dimensional array, each pixel of the plurality of pixels including:

a photoelectric conversion film configured to photoelectrically convert light of a first wavelength and pass light of a second wavelength, and a photoelectric conversion unit configured to photoelectrically convert the light of the second wavelength;

a charge storage unit configured to store charge received from the photoelectric conversion unit of each pixel in a pixel group, wherein the pixel group includes adjacent pixels among the plurality of pixels;

a plurality of through electrodes; and a wiring layer coupled to the photoelectric conversion film of each pixel of the plurality of pixels by at least one through electrode of the plurality of through electrodes.

(12) The semiconductor device as recited in (11) above, wherein the plurality of through electrodes are arranged such that an electrode pitch representing a distance between adjacent through electrodes in a first direction is greater than a pixel pitch representing a distance between adjacent pixels of the pixel group in the first direction.

(13) The semiconductor device as recited in (12) above, wherein the first direction is in a column direction.

(14) The semiconductor device as recited in (12) above, wherein the first direction is in a row direction.

(15) The semiconductor device as recited in any one of (11) to (14) above, further comprising a second charge storage unit configured to store charge received from the photoelectric conversion film.

(16) The semiconductor device as recited in any one of (12) to (15) above, wherein the plurality of through electrodes is arranged such that another electrode pitch representing a distance between adjacent through electrodes in a second direction is greater than another pixel pitch representing a distance between adjacent pixels of the pixel group in the second direction, wherein the first direction is perpendicular to the second direction.

(17) The semiconductor device as recited in any one of (11) to (16) above, wherein the pixel group includes two or more pixels.

(18) The semiconductor device as recited in any one of (11) to (17) above, wherein the photoelectric conversion film includes an organic material.

(19) The semiconductor device as recited in (18) above, wherein the organic material is sandwiched between an upper electrode and a lower electrode.

(20) The semiconductor device as recited in any one of (11) to (19) above, wherein the charge storage unit includes a floating diffusion layer shared by four pixels.

(21) The semiconductor device as recited in any one of (11) to (20) above, wherein the floating diffusion layer is disposed between the plurality of through electrodes in the first direction.

(22) The semiconductor device as recited in any one of (11) to (21) above, further comprising one or more insulating portions formed between each through electrode of the plurality of through electrodes and a substrate.

(23) The semiconductor device as recited in (22) above, wherein the one or more insulating portions are shared among two or more through electrodes of the plurality of through electrodes.

(24) The semiconductor device as recited in any one of (11) to (23) above, wherein the pixel group further includes an amplifier transistor and a transfer transistor.

(25) The semiconductor device as recited in (24) above, wherein a buried gate region of the transfer transistor is buried inside a substrate.

(26) The semiconductor device as recited in any one of (11) to (25) above, further including a microlens disposed above the photoelectric conversion film.

(27) The semiconductor device as recited in any one of (11) to (26) above, wherein the photoelectric conversion unit is within a substrate and the photoelectric conversion film is formed above the substrate.

(28) The semiconductor device as recited in (27) above, wherein the wiring layer is formed on a first side of the substrate, and wherein light is incident on a surface of the substrate that is opposite to a surface of the wiring layer.

(29) The semiconductor device as recited in any one of (11) to (28) above, further comprising a color filter above the photoelectric conversion film.

(30) An electronic apparatus comprising:
a semiconductor device, including:
a plurality of pixels arranged in a two-dimensional array, each pixel of the plurality of pixels including:
a photoelectric conversion film configured to photoelectrically convert light of a first wavelength and pass light of a second wavelength, and
a photoelectric conversion unit configured to photoelectrically convert the light of the second wavelength;
a charge storage unit configured to store charge received from the photoelectric conversion unit of each pixel in a pixel group, wherein the pixel group includes adjacent pixels among the plurality of pixels;
a plurality of through electrodes; and
a wiring layer coupled to the photoelectric conversion film of each pixel of the plurality of pixels by at least one through electrode of the plurality of through electrodes; and
an optical system configured to provide an image on an imaging surface of the semiconductor device and covert the image into electrical signals.

REFERENCE SIGNS LIST

100 Solid-state image sensor
110 Vertical scanning circuit
120 Pixel array unit
130 CDS unit
140 Horizontal scanning circuit
201 Pixel
205 Pixel block
211 Microlens
212 Color filter
213 Passivation layer
214 Upper electrode
215 Photoelectric conversion film
216 Lower electrode
220 Silicon layer
230 Wiring layer
231 Wire
240 Through electrode
241, 242, 243 Insulating portion
250 Photodiode
251 Ion injection plug
270 Floating diffusion layer
281 Amplifier transistor
282, 284 Transfer transistor
283 Selection transistor

What is claimed is:

1. A semiconductor device, comprising:
a plurality of pixels arranged in a two-dimensional array, each pixel of the plurality of pixels including:
a photoelectric conversion film configured to photoelectrically convert light of a first wavelength and pass light of a second wavelength, and
a photoelectric conversion unit configured to photoelectrically convert the light of the second wavelength;
a charge storage unit configured to store charge received from the photoelectric conversion unit of each pixel in a pixel group, wherein the pixel group includes adjacent pixels among the plurality of pixels;
a plurality of through electrodes; and
a wiring layer coupled to the photoelectric conversion film of each pixel of the plurality of pixels by at least one through electrode of the plurality of through electrodes, wherein the plurality of through electrodes are arranged such that an electrode pitch representing a distance between adjacent through electrodes in a first direction is greater than a pixel pitch representing a distance between adjacent pixels of the pixel group in the first direction.

2. The semiconductor device according to claim 1, wherein the first direction is in a column direction.

3. The semiconductor device according to claim 1, wherein the first direction is in a row direction.

4. The semiconductor device according to claim 1, further comprising a second charge storage unit configured to store charge received from the photoelectric conversion film.

5. The semiconductor device according to claim 4, wherein the plurality of through electrodes is arranged such that another electrode pitch representing a distance between adjacent through electrodes in a second direction is greater than another pixel pitch representing a distance between adjacent pixels of the pixel group in the second direction, wherein the first direction is perpendicular to the second direction.

6. The semiconductor device according to claim 1, wherein the pixel group includes two or more pixels.

7. The semiconductor device according to claim 1, wherein the photoelectric conversion film includes an organic material.

8. The semiconductor device according to claim 7, wherein the organic material is sandwiched between an upper electrode and a lower electrode.

9. The semiconductor device according to claim 1, wherein the charge storage unit includes a floating diffusion layer shared by four pixels.

10. The semiconductor device according to claim 9, wherein the floating diffusion layer is disposed between the plurality of through electrodes in the first direction.

11. The semiconductor device according to claim 1, further comprising one or more insulating portions formed between each through electrode of the plurality of through electrodes and a substrate.

12. The semiconductor device according to claim 11, wherein the one or more insulating portions are shared among two or more through electrodes of the plurality of through electrodes.

13. The semiconductor device according to claim 1, wherein the pixel group further includes an amplifier transistor and a transfer transistor.

14. The semiconductor device according to claim 13, wherein a buried gate region of the transfer transistor is buried inside a substrate.

15. The semiconductor device according to claim 1, further including a microlens disposed above the photoelectric conversion film.

16. The semiconductor device according to claim 1, wherein the photoelectric conversion unit is within a substrate and the photoelectric conversion film is formed above the substrate.

17. The semiconductor device according to claim 16, wherein the wiring layer is formed on a first side of the substrate, and wherein light is incident on a surface of the substrate that is opposite to a surface of the wiring layer.

18. The semiconductor device according to claim 1, further comprising a color filter above the photoelectric conversion film.

* * * * *